(12) United States Patent
Kim et al.

(10) Patent No.: US 9,589,605 B1
(45) Date of Patent: Mar. 7, 2017

(54) SEMICONDUCTOR MEMORY DEVICE WITH INPUT/OUTPUT LINE

(71) Applicant: SK hynix Inc., Icheon-si, Gyeonggi-do (KR)

(72) Inventors: Tae Kyun Kim, Icheon-si (KR); Jin Hee Cho, Cheongju-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/937,473

(22) Filed: Nov. 10, 2015

(30) Foreign Application Priority Data

Aug. 21, 2015 (KR) .................. 10-2015-0117927

(51) Int. Cl.
  *G11C 7/10* (2006.01)
  *G11C 7/06* (2006.01)
  *G11C 8/10* (2006.01)

(52) U.S. Cl.
  CPC .................. *G11C 7/10* (2013.01); *G11C 7/06* (2013.01); *G11C 8/10* (2013.01)

(58) Field of Classification Search
  CPC .............. G11C 7/10; G11C 7/06; G11C 8/10
  USPC ................................... 365/189.011
  See application file for complete search history.

(56) References Cited

U.S. PATENT DOCUMENTS

| 7,203,101 | B2* | 4/2007 | Kajigaya | G11C 5/025 365/189.02 |
| 7,345,929 | B2* | 3/2008 | Kajigaya | G11C 5/025 257/202 |
| 7,499,340 | B2* | 3/2009 | Kajigaya | G11C 5/025 257/202 |
| 8,891,324 | B2 | 11/2014 | Yi et al. | |
| 9,037,949 | B1* | 5/2015 | Vogelsang | G06F 11/1048 714/724 |
| 2007/0242535 | A1* | 10/2007 | Kajigaya | G11C 5/025 365/189.09 |
| 2016/0163365 | A1* | 6/2016 | Yang | G11C 7/065 365/51 |

FOREIGN PATENT DOCUMENTS

KR    1020120087665 A    8/2012

\* cited by examiner

*Primary Examiner* — Han Yang
*Assistant Examiner* — Xiaochun L Chen
(74) *Attorney, Agent, or Firm* — William Park & Associates Ltd.

(57) ABSTRACT

Various embodiments relate to a semiconductor device. The semiconductor device may include a plurality of mats configured to input and output the data of memory cells through a plurality of mat input/output lines. The semiconductor device may include a plurality of input/output lines coupled to the plurality of mat input/output lines and configured to input and output data. The semiconductor device may include mat control units disposed between the plurality of mats and configured to control the operations of the mats. The plurality of mat input/output lines may be grouped into a plurality of data line groups having the same characteristic, and some of the plurality of data line groups may be disposed to overlap with the mat control units.

28 Claims, 4 Drawing Sheets though a plurality of mat input/output lines. The semiconductor device may include a plurality of input/output lines coupled to the plurality of mat input/output lines and configured to input and output data. The semiconductor device may include mat control units disposed between the plurality of mats and configured to control the operations of the mats. The plurality of mat input/output lines may be grouped into a plurality of data line groups having the same characteristic, and some of the plurality of data line groups may be disposed to overlap with the mat control units.

SEMICONDUCTOR MEMORY DEVICE WITH INPUT/OUTPUT LINE

CROSS-REFERENCES TO RELATED APPLICATION

The present application claims priority under 35 U.S.C. §119(a) to Korean application number 10-2015-0117927, filed on Aug. 21, 2015, in the Korean Intellectual Property Office, which is incorporated herein by reference in its entirety.

BACKGROUND

1. Technical Field

Various embodiments generally relate to a semiconductor device, and more particularly, to a technology capable of reducing the number of cell mats.

2. Related Art

A known semiconductor device consists of a plurality of memory cell arrays consisting of a plurality of unit cells. The plurality of memory cell arrays store and output data in response to an address. The semiconductor device also consists of a plurality of sense amplifier arrays configured to amplify a data signal output by a cell array and the sense amplifier outputs the amplified signal.

Recently, in order to improve competitiveness in the manufacturing cost of a semiconductor memory device, efforts to develop technologies for increasing a net die are made. As one of the technologies, there is proposed a technology for changing a cell array structure of 8F2 (i.e., an array occupying a 2F×4F=8F2 unit area or eight-square feature cell) into a cell array structure of 6F2 or 4F2. The cell array structure of 6F2 recently continues to be in the spotlight because more cells can be integrated per unit area compared to the cell array structure of 8F2.

In general, a folded bit line structure is applied to the cell array structure of 8F2, and an open bit line structure is applied to the cell array structure of 6F2. In this case, the folded bit line structure has a structure in which a bit line BL and a bit-bar line BLB are formed in parallel in one direction of a sense amplifier. The open bit line structure has a structure in which a bit line and a bit-bar line are separated on both sides of a sense amplifier.

SUMMARY

In an embodiment, a semiconductor device may be provided. The semiconductor device may include a plurality of mats configured to input and output the data of memory cells through a plurality of mat input/output lines. The semiconductor device may include a plurality of input/output lines coupled to the plurality of mat input/output lines and configured to input and output data. The semiconductor device may include mat control units disposed between the plurality of mats and configured to control the operations of the mats. The plurality of mat input/output lines may be grouped into a plurality of data line groups having the same characteristic, and some of the plurality of data line groups may be disposed to overlap with the mat control units.

In an embodiment, a semiconductor device may be provided. The semiconductor device may include a first mat, and a second mat disposed adjacent to the first mat. The semiconductor device may include a mat control unit disposed between the first mat and the second mat. The semiconductor device may include a first data line group disposed in the first mat and configured to input and output the data of memory cells. The semiconductor device may include a second data line group configured to input and output data of memory cells of the first mat and the second mat and may be disposed to overlap with the mat control unit. The semiconductor device may include a third data line group disposed in the second mat and configured to input and output the data of memory cells.

DETAILED DESCRIPTION

The open bit line structure is described below. A semiconductor device having the open bit line structure may include a plurality of memory cell mats, a plurality of sense amplifier (SA) arrays, and dummy mats.

Memory cells for storing data may be formed in each of the plurality of memory cell mats. The memory cells may be disposed in regions in which bit lines cross word lines and regions in which bit-bar lines BLB cross sub-word lines SWL. In this example, a memory cell includes an NMOS transistor, that is, a cell transistor, and a cell capacitor.

The dummy mats may be mats disposed at the top and bottom of the memory cell mats, that is, mats disposed in the outskirts of memory cell blocks. A dummy mat may be disposed under a target cell mat, and may function to provide the target cell mat with a level of a bit-bar line which will become the subject of comparison. As in each memory cell array block, a plurality of bit lines and a plurality of dummy word lines may be intersected and arranged in the dummy mat.

However, a bit line (or bit-bar line) occupies an unnecessary area because only a bit-bar line (or bit line) that will be compared with a target cell mat within a dummy mat and that is coupled to a sense amplifier operates and the bit line (or bit-bar line) does not operate in the dummy mat. Accordingly, a net die may be decreased.

Furthermore, there are problems in that a voltage applied to a memory cell is lowered and a tolerance to a soft error is deteriorated because a cell size is reduced. As a semiconductor integration device using an error correction code (ECC) circuit for correcting such a data error, there has been disclosed a circuit technology for correcting a fail bit by adding parity bits to common data.

Various embodiments may be directed to a reduction in the number of cell mats and mat control units by grouping the data lines of a semiconductor device differently from a prior art.

Hereinafter, a semiconductor device will be described below with reference to the accompanying drawings through various examples of embodiments.

In an embodiment, a semiconductor device may include a plurality of memory cells and a circuit for controlling the memory cells. A structure in which a plurality of memory cells of such a semiconductor device is arranged is described below with reference to FIG. 1.

Figure 1:
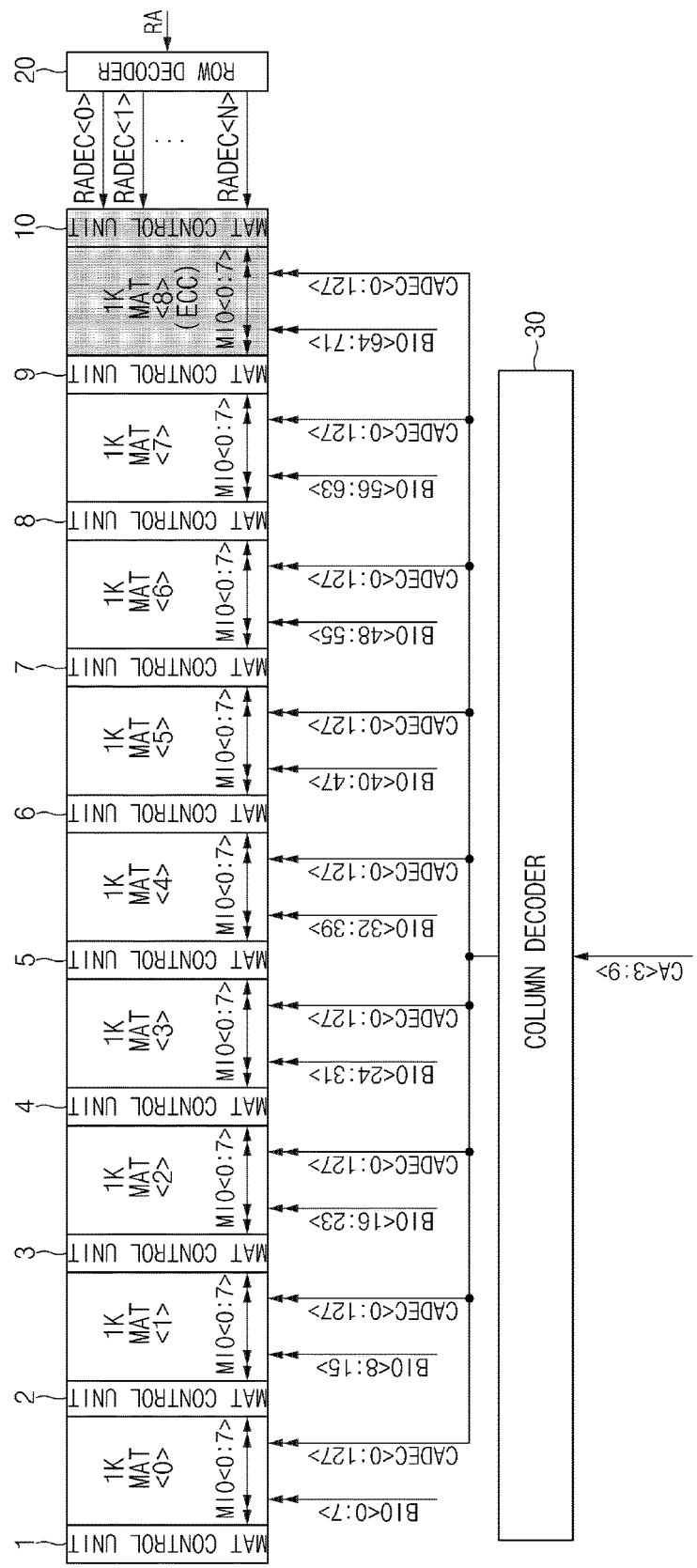
FIG. 1 is a diagram illustrating a representation of an example of the structure of a semiconductor device including a dummy mat.

FIG. 1 is a diagram illustrating a representation of an example of the structure of a semiconductor device including a dummy mat.

The semiconductor device may be divided into a plurality of banks and may be driven. Each of the plurality of banks may include a plurality of mats MAT0~MAT8 each including a plurality of memory cells. For example, a memory cell array is divided into sets of the plurality of unit memory cell mats MAT0~MAT8. A plurality of the mats MAT0~MAT8 is arranged in a row direction and column direction, thus forming a plurality of mat rows and a plurality of mat columns.

In an embodiment, the mat MAT8 that belongs to the plurality of mats MAT0~MAT8 and that is disposed in the outermost edge may be used as a dummy mat. The dummy mat MAT8 may be allocated for error correction code (ECC).

Referring to FIG. 1, a single mat MAT0 is assumed to have a size of 1 K bit. In this example, the 1 K bit may mean the number of memory cells included in each mat MAT, that is, the number of column lines to and from which data is inputted and output. In this example, a single bank including the plurality of mats MAT0~MAT8 has a total size of 9 K bits.

In an embodiment, a plurality of mat control units 1 to 10 may be arranged in regions between the plurality of mats MAT0~MAT8. In this example, the mat control units 1 to 10 may include a plurality of sub-word line drivers configured to drive sub-word lines (not illustrated) coupled to the gates of cell transistors (not illustrated) of the respective mats MAT0~MAT8 and switch elements capable of switching input/output lines.

In an embodiment, in each of the mats MAT0~MAT8, data of a specific unit may be inputted and output by mat input/output lines MIO<0:7>. That is, the mat input/output lines MIO<0:7> are disposed in the mats MAT0~MAT8 in a one-to-one way.

In an embodiment, a row decoder 20 may decode a row address RA and output a plurality of row decoding signals RADEC to the plurality of mats MAT0~MAT8. The row lines of the plurality of mats MAT0~MAT8 are selected in response to the plurality of row decoding signals RADEC.

In an embodiment, a column decoder 30 may decode column addresses CA<3:9> and output a plurality of column decoding signals CADEC<0:127> to the plurality of mats MAT0~MAT8. The column lines of the plurality of mats MAT0~MAT8 are selected in response to the plurality of column decoding signals CADEC<0:127>.

In an embodiment, input/output lines BIO<0:71> are classified according to the mats MAT0~MAT8 and are coupled to the mat input/output lines MIO<0:7> (i.e., data lines MIO<0:7>).

Recently, as the integration of semiconductor devices is increased, the number of data input/output lines tends to increase geometrically. For example, a double-data-rate two DDR2 device requires 2 to 8 data input/output lines, whereas a double-data-rate three DDR3 device requires 8 to 16 data input/output lines.

For example, if the dummy mat MAT8 for ECC is additionally increased, the size of mats is inevitably increased. Accordingly, the number of mats MAT0~MAT8 and the number of mat control units 1 to 10 for controlling the mats are increased. As a result, current consumption is increased, and an increase in the number of semiconductor chips per wafer is limited. Accordingly, there is a need for a technology capable of reducing the number of mats MAT0~MAT8 and the number of mat control units 1 to 10 for controlling the mats within the same chip size.

Figure 2:
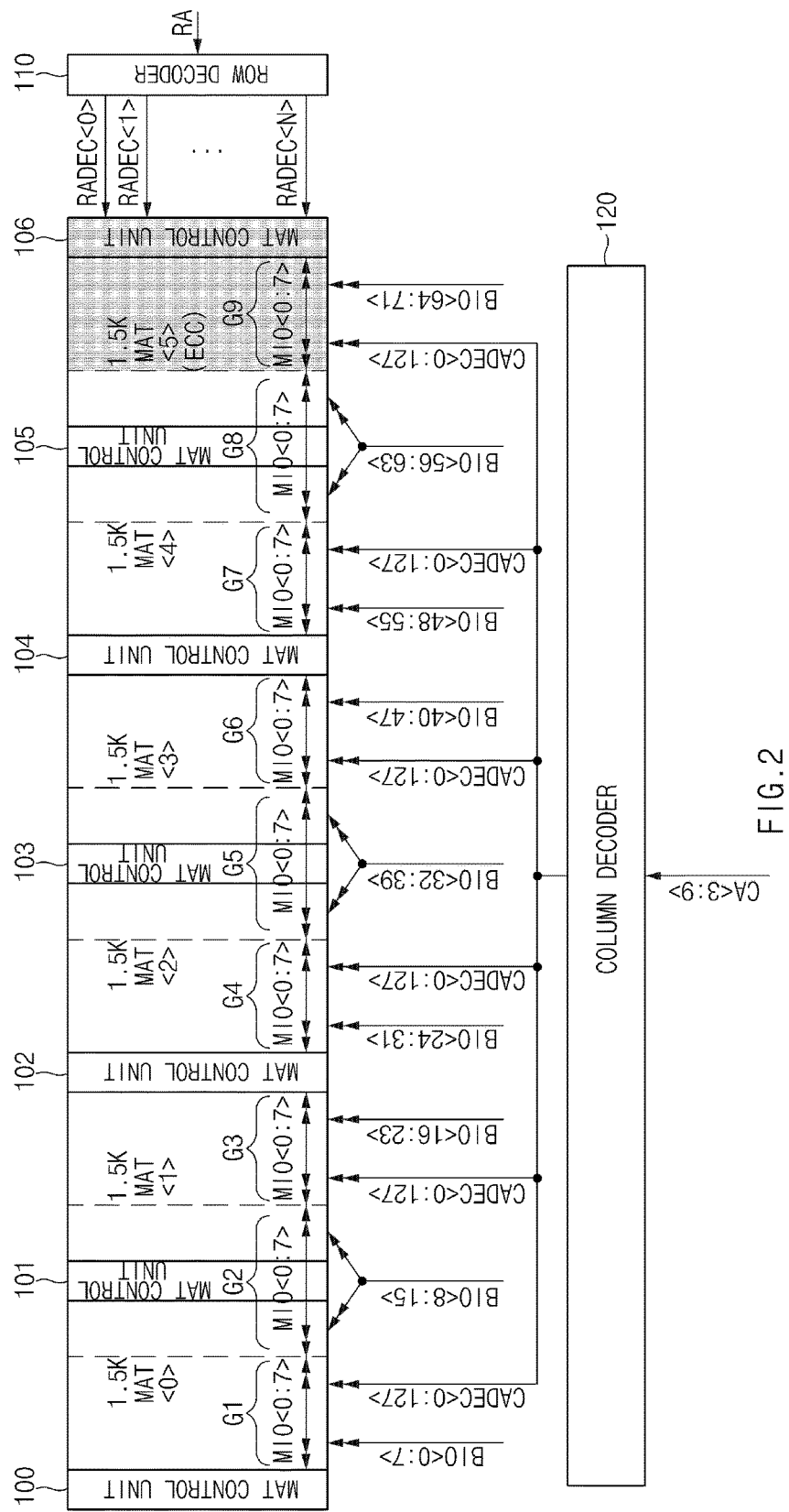
FIG. 2 is a diagram illustrating a representation of an example of the configuration of a semiconductor device according to an embodiment.

FIG. 2 is a diagram illustrating a representation of an example of the configuration of a semiconductor device according to an embodiment.

The semiconductor device may be divided into a plurality of banks and may be driven. Each of a plurality of banks may include a plurality of mats MAT0~MAT5 including a plurality of memory cells. The plurality of mats MAT0~MAT5 may mean a unit cell array including X×Y memory cells. In this example, X is indicative of the number of memory cells in a word line direction within the unit mat MAT, and Y is indicative of the number of memory cells in a bit line direction within the unit mat MAT.

For example, the memory cell array is divided into sets of the plurality of unit memory cell mats MAT0~MAT5. A plurality of the mats MAT0~MAT5 is arranged in a row direction and column direction, thus forming a plurality of mat rows and a plurality of mat columns.

In an embodiment, the mat MAT5 that is from the plurality of mats MAT0~MAT5 and that is placed in the outermost edge may be used as a dummy mat. Such a dummy mat MAT5 may be allocated for error correction code (ECC).

For example, the plurality of mats MAT0~MAT5 may be arranged in a memory cell group having various sizes, such as 512 K, 640 K, 768 K, 832 K, 1 M, and 1.2 M. In this example, the mat size of 512 K means that the number of word lines is 512 and the number of bit lines is 1024.

In 512 K, numbers "512" may be indicative of the number of memory cells coupled to each bit line of a sense amplifier. That is, for a mat size of 640 K, it means that 640 K memory cells may be coupled to each bit line. If a redundant word line for repair is added, the size of each of the mats MAT0~MAT5 may be increased by the number of redundant word lines.

A burst length and the number of data input/output lines may be different depending on the type and structure of the semiconductor device. The number of selected column lines may be different depending on the burst length and the number of data input/output lines of the semiconductor device. A different number of column selection signals are activated in response to external input column addresses CA. Accordingly, the data of a sense amplifier that belongs to the sensing unit of a mat MAT selected in response to a read/write command and that is selected in response to a column selection signal may be inputted and output.

In each of the mats MAT0~MAT5, data of a specific unit is inputted and output by the mat input/output lines MIO<0: 7>. In an embodiment, a plurality of mat control units 100~106 may be arranged in regions between the plurality of mats MAT0~MAT5.

In an embodiment, the mat control units 100~106 may include a plurality of sub-word line drivers configured to drive sub-word lines (not illustrated) coupled to the gates of cell transistors (not illustrated) of the mats MAT0~MAT5, a switch element configured to switch input/output lines, a switching circuit configured to process data, a precharge circuit, and a control circuit unit configured to control the state of word lines and bit lines.

In an embodiment, a row decoder 110 decodes a row address RA and outputs a plurality of row decoding signals RADEC to the plurality of mats MAT0~MAT5. The row lines of the plurality of mats MAT0~MAT5 are selected in response to the plurality of row decoding signals RADEC.

In an embodiment, a column decoder 120 decodes column addresses CA<3:9> and outputs a plurality of column decoding signals CADEC<0:127> to the plurality of mats MAT0~MAT5. The column lines of the plurality of mats MAT0~MAT5 are selected in response to the plurality of column decoding signals CADEC<0:127>.

In an embodiment, input/output lines BIO<0:71> are coupled to the mat input/output lines MIO<0:7> of the mats MAT0~MAT5. For example, the input/output lines BIO<0:71> are classified by every 8 input/output lines and are coupled to the 8 mat input/output lines MIO<0:7>.

In an embodiment, the mat input/output lines MIO<0:7> are grouped into a plurality of data line groups G1~G9. In this example, each of the data line groups G1~G9 means a data group using the same input/output bus (i.e., input/output lines BIO etc.).

All the mats MAT0~MAT5 may be uniformly grouped into the data line groups G1~G9 within a unit bank regardless of the normal mats MAT0~MAT4 and the dummy mat MAT5. In an embodiment, the plurality of data line groups G1~G9 are not disposed in a one-to-one way for the mats MAT0~MAT5, but some data line groups G2, G5, and G8 are disposed to overlap with the mat control units 101, 103, and 105.

For example, some data line groups G2, G5, and G8 of the plurality of data line groups G1~G9 share mats on both sides and the mat input/output lines MIO<0:7>. For example, the data line group G2 shares the mats MAT0 and MAT1 and the mat input/output lines MIO<0:7>. For example, the data line group G5 shares the mats MAT2 and MAT3 on both sides and the mat input/output lines MIO<0:7>. For example, the data line group G8 shares the mats MAT4 and MAT5 on both sides and the mat input/output lines MIO<0:7>.

The mat input/output lines MIO<0:7> coupled to the mats MAT0~MAT5 are coupled to the input/output lines BIO<0:71>. In this example, the data line groups G1, G3, G4, G6, G7, and G9 of the plurality of data line groups G1~G9 are respectively coupled to the input/output lines BIO<0:7>, BIO<16:23>, BIO<24:31>, BIO<40:47>, BIO<48:55>, and BIO<64:71>. In an embodiment, the data line groups G2, G5, and G8 of the plurality of data line groups G1~G9 are respectively coupled to the input/output lines BIO<8:15>, BIO<32:39>, and BIO<56:63>.

The size of the mat MAT0 may be determined by the sum of all the mat input/output lines MIO<0:7> of the data line group G1 and half of the mat input/output lines MIO<0:7> of the data line group G2. That is, different data line groups are disposed in a single unit mat MAT0.

In an embodiment, the size of the mat MAT1 is determined by the sum of all the mat input/output lines MIO<0:7> of the data line group G3 and the remaining half of the mat input/output lines MIO<0:7> of the data line group G2. That is, different data line groups are disposed in a single unit mat MAT1.

In an embodiment, the size of the mat MAT2 is determined by the sum of all the mat input/output lines MIO<0:7> of the data line group G4 and half of the mat input/output lines MIO<0:7> of the data line group G5. That is, different data line groups are disposed in a single unit mat MAT2.

In an embodiment, the mat MAT3 is determined by the sum of all the mat input/output lines MIO<0:7> of the data line group G6 and the remaining half of the mat input/output lines MIO<0:7> of the data line group G5. That is, different data line groups are disposed in a single unit mat MAT3.

In an embodiment, the size of the mat MAT4 is determined by the sum of the sum of all the mat input/output lines MIO<0:7> of the data line group G7 and half of the mat input/output lines MIO<0:7> of the data line group G8. That is, different data line groups are disposed in a single unit mat MAT4.

In an embodiment, the size of the mat MAT5 is determined by the sum of all the mat input/output lines MIO<0:7> of the data line group G9 and the remaining half of the mat input/output lines MIO<0:7> of the data line group G8. That is, different data line groups are disposed in a single unit mat MAT5.

For example, the size of the mat input/output lines MIO<0:7> of each of the data line groups G1~G9 is assumed to be 1 K bit. In an embodiment, the size of each of the mats MAT0~MAT5 may be 1.5 K bit. In this example, the 1.5K bit may mean the number of memory cells included in each mat MAT, that is, a bundle of cell sizes in which data is inputted and output.

Accordingly, a single bank including the plurality of mats MAT0~MAT4 and the dummy mat MAT5 allocated for ECC has a total size of 9 K bits. The data line groups G2, G5, and G8 share the mat input/output lines MIO<0:7> of 0.5K bit along with an adjacent mat MAT. The plurality of groups G1~G9 included in the total size of 9 K bits are grouped so that they have the same characteristic and the same size.

Referring to FIG. 1, if a single data line group is symmetrically disposed in a single mat in a one-to-one way, a single mat MAT becomes 1 K bit, and a total size of a bank becomes 9 K bits. In this example, a total number of 10 mat control units 1 to 10 are required.

However, in an embodiment, a single data line group is not symmetrically disposed in a single mat in a one-to-one way, but 1.5K bit data line groups G are disposed in a single mat MAT. That is, in an embodiment, the number of cells of an existing column line of 1 K bit is increased to 1.5K bit.

Accordingly, a total size of the bank is 9 K bits as in FIG. 1, but the number of mats can be reduced to 6. Accordingly, 7 mat control units 100~106 only have to be included. In this example, current consumption can be reduced because the number of mats MAT0~MAT5 and the number of mat control units 100~106 are reduced compared to FIG. 1.

Furthermore, in an embodiment, a column size in the mat MAT has been extended. However, the number of cells coupled to each mat input/output line MIO is 1 K bit, and the characteristics of each mat input/output line MIO are the same as that of FIG. 1.

Figure 3:
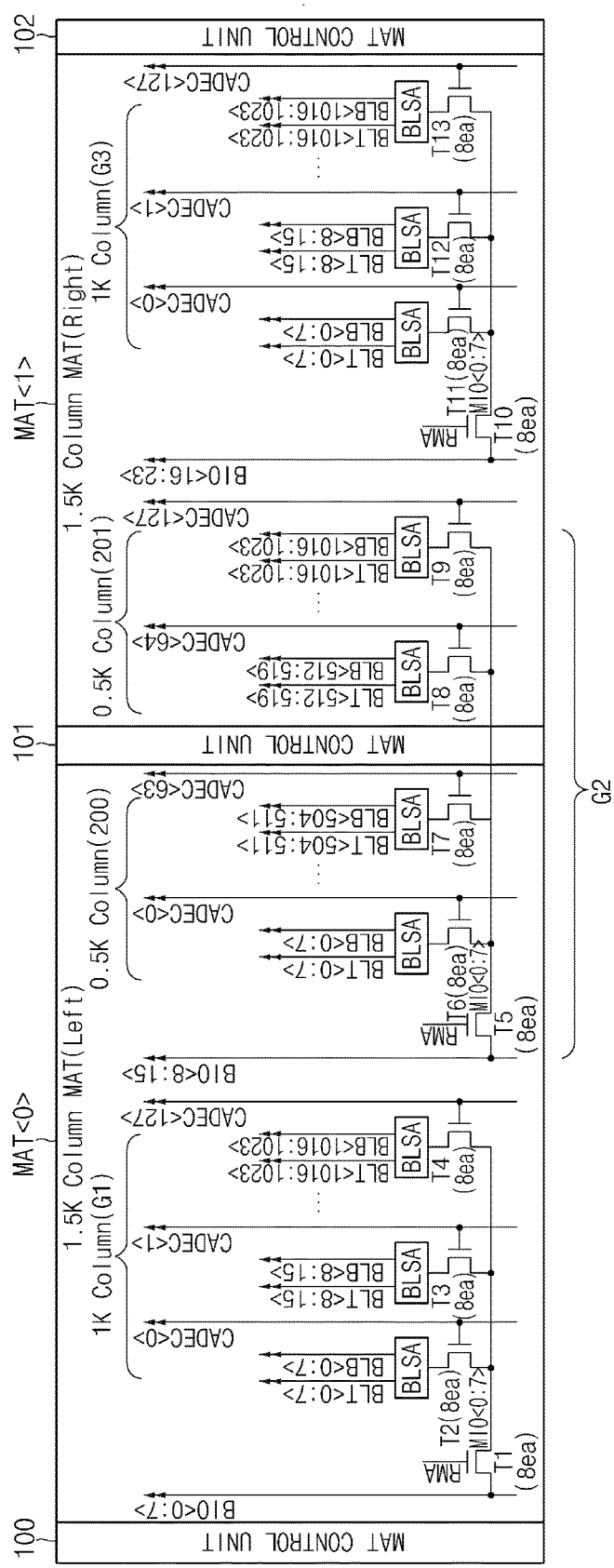
FIG. 3 is a circuit diagram illustrating a representation of an example of the mats of FIG. 2.

FIG. 3 is a circuit diagram illustrating a representation of an example of the mats MAT0 and MAT1 of FIG. 2.

The mat input/output lines MIO<0:7> of the data line group G1 included in the mat MAT0 are selectively coupled to a bit line sense amplifier BLSA through switching elements T2~T4. In the single data line group G1, for example, if 128 column decoding signals CADEC<0:127> are addressed based on 8 bit line sense amplifiers BLSA, the size of the mat MAT of 1 K bit is obtained.

In this example, the switching elements T2~T4 are controlled by the column decoding signals CADEC<0:127> and selectively couple the bit line sense amplifiers BLSA and the mat input/output lines MIO<0:7>. In an embodiment, the switching element T1 is controlled by a line control signal RMA and selectively couples the mat input/output lines MIO<0:7> and the input/output lines BIO<0:7>.

In an embodiment, the bit line sense amplifiers BLSA sense and amplify cell data. In this example, the plurality of bit line sense amplifiers BLSA may be selected by the column decoding signals CADEC<0:127>. The plurality of bit line sense amplifiers BLSA are coupled to memory cells through bit line pairs BLT<0:1023> and BLB<0:1023>.

In an embodiment, the mat input/output lines MIO<0:7> of the data line group G2 are shared by the mats MAT0 and MAT1. A half group 200 that belongs to the data line group G2 and that is disposed in the mat MAT0 is selectively coupled to the bit line sense amplifiers BLSA through switching elements T6 and T7.

In this example, the switching elements T6 and T7 are controlled by the column decoding signals CADEC<0:63> and selectively couple the bit line sense amplifiers BLSA and the mat input/output lines MIO<0:7>. In an embodiment, the switching element T5 is controlled by the line control signal RMA and selectively couples the mat input/output lines MIO<0:7> and the input/output lines BIO<8:15>.

In an embodiment, the bit line sense amplifiers BLSA sense and amplify cell data. In this example, the plurality of bit line sense amplifiers BLSA may be selected by the column decoding signals CADEC<0:63>. The plurality of bit line sense amplifiers BLSA is coupled to memory cells through bit line pairs BLT<0:511> and BLB<0:511>.

In an embodiment, a half group 201 that belongs to the data line group G2 and that is disposed in the mat MAT1 is selectively coupled to the bit line sense amplifiers BLSA through the switching elements T8 and T9.

In this example, the switching elements T8 and T9 are controlled by the column decoding signals CADEC<64:127> and selectively couples the bit line sense amplifiers BLSA and the mat input/output lines MIO<0:7>.

In an embodiment, the bit line sense amplifiers BLSA sense and amplify cell data. In this example, the plurality of bit line sense amplifiers BLSA may be selected by the column decoding signals CADEC<64:127>. The plurality of bit line sense amplifiers BLSA is coupled to memory cells through bit line pairs BLT<512:1023> and BLB<512:1023>.

The column decoding signals CADEC<0:63>, the bit line sense amplifiers BLSA, and the switching elements T6 and T7 may be disposed in the half group 200 of the data line group G2 so that the half group 200 may have a size that is half the size of the data line group G1. The column decoding signals CADEC<64:127>, the bit line sense amplifiers BLSA, and the switching elements T8 and T9 may be disposed in the remaining half group 201 of the data line group G2 so that the remaining half group 201 may have a size that is half the size of the data line group G1.

The mat input/output lines MIO<0:7> of the data line group G2 may be shared by the mats MAT0 and MAT1. The input/output lines BIO<8:15> may be disposed in the mat MAT0, but are not disposed in the mat MAT1 adjacent to the mat MAT0. In an embodiment, the mat input/output lines MIO<0:7> of the data line group G2 are disposed to pass through the mat control unit 101. In an embodiment, the mat input/output lines MIO<0:7> of the data line group G2 are disposed to overlap with the mat control unit 101.

In an embodiment, the mat input/output lines MIO<0:7> of the data line group G3 included in the mat MAT1 are selectively coupled to the bit line sense amplifiers BLSA through switching elements T11~T13.

In this example, the switching elements T11~T13 are controlled by the column decoding signals CADEC<0:127> and selectively couple the bit line sense amplifiers BLSA and the mat input/output lines MIO<0:7>. In an embodiment, the switching element T10 is controlled by the line control signal RMA and selectively couples the mat input/output lines MIO<0:7> and the input/output lines BIO<16:23>.

In an embodiment, the bit line sense amplifiers BLSA sense and amplify cell data. In this example, the plurality of bit line sense amplifiers BLSA may be selected by the column decoding signals CADEC<0:127>. The plurality of bit line sense amplifiers BLSA is coupled to memory cells through the bit line pairs BLT<0:1023> and BLB<0:1023>.

As described above, in an embodiment, the mat MAT0 disposed on the left side of the mat control unit 101 may have a size of 1.5K bit, that is, the sum of 1 K bit for the data line group G1 and 0.5 K bit for the half group 200. That is, the data line group G1 of 1 K bit and the data line group 200 of 0.5K bit may be separated and disposed in the mat MAT0.

The mat MAT1 disposed on the right side of the mat control unit 101 may have a size of 1.5K bit, that is, the sum of 1 K bit for the data line group G3 and 0.5K bit for the half group 201. That is, the data line group G3 of 1 K bit and the data line group 201 of 0.5K bit may be separated and disposed in the mat MAT1.

In an embodiment, an example in which the number of mats MAT is 6, the size of each mat MAT is 1.5K bit, the number of mat input/output lines MIO is 8, and the number of input/output lines BIO is 72 has been illustrated. However, the embodiments are not limited to the size and numbers, and the size and number of lines of each element may be changed.

The embodiments provide advantages in that they can reduce the number of cell mats and mat control units of a semiconductor device and can reduce corresponding current consumption.

Figure 4:
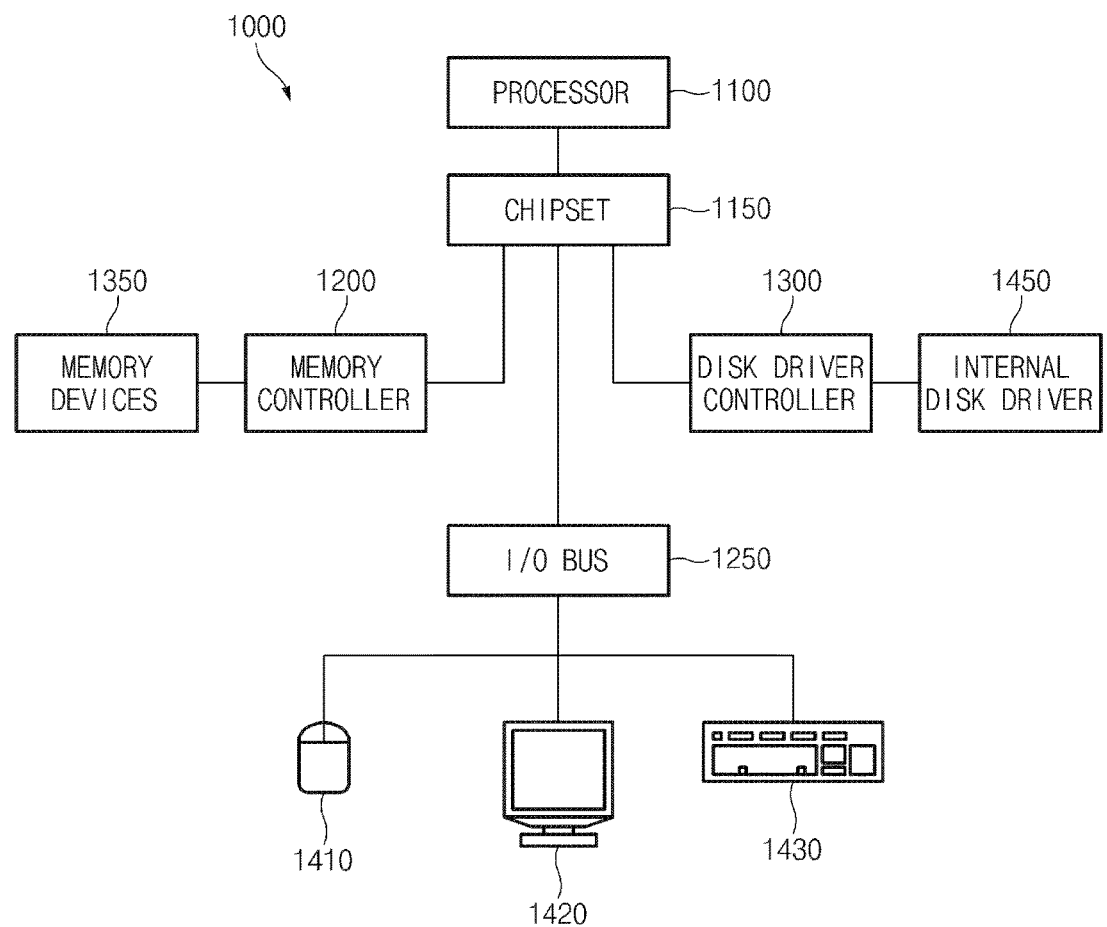
FIG. 4 illustrates a block diagram of an example of a representation of a system employing a device and/or semiconductor device in accordance with the various embodiments discussed above with relation to FIGS. 1-3.

The semiconductor device discussed above (see FIGS. 1-3) are particular useful in the design of memory devices, processors, and computer systems. For example, referring to FIG. 4, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor device as discussed above with relation to FIGS. 1-3. In alternate embodiments, such as, for example but not limited to, cellular phones or digital cameras, the components may differ from the embodiments illustrated in FIG. 4.

While various embodiments have been described above, it will be understood to those skilled in the art that the embodiments described are by way of example only. Accordingly, the device described herein should not be limited based on the described embodiments.

What is claimed is:

1. A semiconductor device, comprising:
a plurality of mats configured to input and output data of memory cells through a plurality of mat input/output lines;
a plurality of input/output lines coupled to the plurality of mat input/output lines and configured to input and output data; and
mat control units disposed between the plurality of mats and configured to control operations of the mats,
wherein the plurality of mat input/output lines is grouped into a plurality of data line groups having an identical characteristic, and some of the plurality of data line groups are disposed to overlap with the mat control units,
wherein a size of each of the plurality of mats is a sum of the size of one of the plurality of data line groups and half a size of an adjacent data line group.

2. The semiconductor device of claim 1, wherein a mat belonging to the plurality of mats and disposed in an outermost edge comprises a dummy mat.

3. The semiconductor device of claim 2, wherein the dummy mat is allocated for error correction code (ECC).

4. The semiconductor device of claim 1, further comprising:
a row decoder configured to generate row decoding signals for selecting row lines of the plurality of mats by decoding a row address; and
a column decoder configured to generate column decoding signals for selecting column lines of the plurality of mats by decoding a column address.

5. The semiconductor device of claim 1, wherein some of the plurality of data line groups share adjacent mats and mat input/output lines.

6. The semiconductor device of claim 1, wherein a size of each of the plurality of mats is a sum of the size of one of the plurality of data line groups and less a size of an adjacent data line group.

7. The semiconductor device of claim 1, wherein different data line groups are disposed in each of the plurality of mats.

8. The semiconductor device of claim 1, wherein the plurality of mat input/output lines of the plurality of data line groups is grouped to have an identical column line sizes.

9. The semiconductor device of claim 1, wherein a first mat of the plurality of mats comprises:
a first switching element group configured to selectively couple mat input/output lines of a first data line group of the plurality of data line groups and bit line sense amplifiers of a first group;
a second switching element group to selectively couple the mat input/output lines of the first data line group and mat input/output lines of the first group;
a third switching element group to selectively couple mat input/output lines of a second data line group of the plurality of data line groups and bit line sense amplifiers of a second group; and
a fourth switching element group to selectively couple the mat input/output lines of the second data line group and input/output lines of the second group.

10. The semiconductor device of claim 9, wherein column decoding signals which are half a number of column decoding signals of the first switching element group are applied to the third switching element group.

11. The semiconductor device of claim 9, wherein the third switching element group is coupled to bit line sense amplifiers which are half a number of bit line sense amplifiers of the first switching element group.

12. The semiconductor device of claim 1, wherein a second mat of the plurality of mats comprises:
a fifth switching element group configured to selectively couple mat input/output lines of a third data line group of the plurality of data line groups and bit line sense amplifiers of a fourth group;
a sixth switching element group configured to selectively couple mat input/output lines of the third data line group and input/output lines of a third group; and
a seventh switching element group configured to selectively couple mat input/output lines of a second data line group of the plurality of data line groups and bit line sense amplifiers of the third group.

13. The semiconductor device of claim 12, wherein column decoding signals which are half a number of column decoding signals of the fifth switching element group are applied to the seventh switching element group.

14. The semiconductor device of claim 12, wherein the seventh switching element group is connected to bit line sense amplifiers which are half a number of bit line sense amplifiers of the fifth switching element group.

15. The semiconductor device of claim 1, wherein a input/output line group connected to the some of the plurality of data line groups is disposed only in any one of adjacent two mats.

16. A semiconductor device, comprising:
a first mat;
a second mat disposed adjacent to the first mat;
a mat control unit disposed between the first mat and the second mat;
a first data line group disposed in the first mat and configured to input and output data of memory cells;
a second data line group configured to input and output data of memory cells of the first mat and the second mat and disposed to overlap with the mat control unit; and
a third data line group disposed in the second mat and configured to input and output data of memory cells,
wherein mat input/output lines of the first data line group, mat input/output lines of the second data line group, and mat input/output lines of the third data line group are grouped into a plurality of data line groups having an identical characteristic.

17. The semiconductor device of claim 16, wherein the first mat comprises a dummy mat.

18. The semiconductor device of claim 17, wherein the dummy mat is allocated for error correction code (ECC).

19. The semiconductor device of claim 16, wherein the mat input/output lines of the second data line group are shared by the first mat and the second mat.

20. A semiconductor device, comprising:
a plurality of mats configured to input and output data of memory cells through a plurality of mat input/output lines;
a plurality of input/output lines coupled to the plurality of mat input/output lines and configured to input and output data,
wherein a first group of input/output lines from the plurality of input/output lines is only coupled with a single mat from the plurality of mats, and
wherein a second group of input/output lines from the plurality of input/output lines is coupled with two different mats from the plurality of mats,
wherein one of the two different mats coupled with the second group of input/output lines is coupled with the first group of input/output lines.

21. The semiconductor device of claim 20, further comprising:
mat control units disposed between the plurality of mats and configured to control operations of the mats.

22. The semiconductor device of claim 20, wherein the two different mats are adjacent to one another.

23. The semiconductor device of claim 20, wherein the plurality of mat input/output lines is grouped into a plurality of data line groups having an identical characteristic, and some of the plurality of data line groups are disposed to overlap with the mat control units.

24. The semiconductor device of claim 20, wherein the first group and the second group have the same number of input/output lines.

25. A semiconductor device, comprising:
a plurality of mats configured to input and output data of memory cells through a plurality of mat input/output lines; and
mat control units disposed between the plurality of mats and configured to control operations of the mats,
wherein some mat input/output lines from the plurality of mat input/output lines pass through a mat control unit,
wherein the plurality of mat input/output lines are grouped into a plurality of data line groups and a size of each of the plurality of mats is a sum of the size of one of the plurality of data line groups and half a size of an adjacent data line group.

26. The semiconductor device of claim 25, further comprising:
a plurality of input/output lines coupled to the plurality of mat input/output lines and configured to input and output data.

27. The semiconductor device of claim 25, wherein the plurality of mat input/output lines is grouped into a plurality of data line groups having an identical characteristic, and some of the plurality of data line groups are disposed to overlap with the mat control units.

28. The semiconductor device of claim 26,
wherein a first group of input/output lines from the plurality of input/output lines is only coupled with a single mat from the plurality of mats, and
wherein a second group of input/output lines from the plurality of input/output lines is coupled with two different mats from the plurality of mats.

* * * * *